United States Patent [19]
Endo

[11] Patent Number: 5,974,816
[45] Date of Patent: *Nov. 2, 1999

[54] TEMPERATURE-CONTROL METHOD AND APPARATUS

[75] Inventor: Yutaka Endo, Yokohama, Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/828,386

[22] Filed: Mar. 28, 1997

[30] Foreign Application Priority Data

Mar. 29, 1996 [JP] Japan ................................ 8-103599

[51] Int. Cl.⁶ .................................................. F25D 17/00
[52] U.S. Cl. ............................. 62/179; 62/185; 62/441; 62/333
[58] Field of Search ............................. 62/185, 179, 333, 62/332, 440, 441

[56] References Cited

U.S. PATENT DOCUMENTS

| | | | |
|---|---|---|---|
| 3,611,745 | 10/1971 | Schlemmer | 62/333 |
| 4,383,421 | 5/1983 | Quesnoit | 62/333 |
| 4,856,285 | 8/1989 | Acharya et al. | 62/332 |
| 5,372,014 | 12/1994 | Adams | 62/175 |
| 5,694,776 | 12/1997 | Sahm | 62/332 |

*Primary Examiner*—William Doerrler
*Attorney, Agent, or Firm*—Michael N. Meller; Eugene Lieberstein

[57] ABSTRACT

A method and apparatus for cooling different media which separately control the temperature of a plurality of chambers. A common refrigerant is used for cooling the different media.

4 Claims, 1 Drawing Sheet

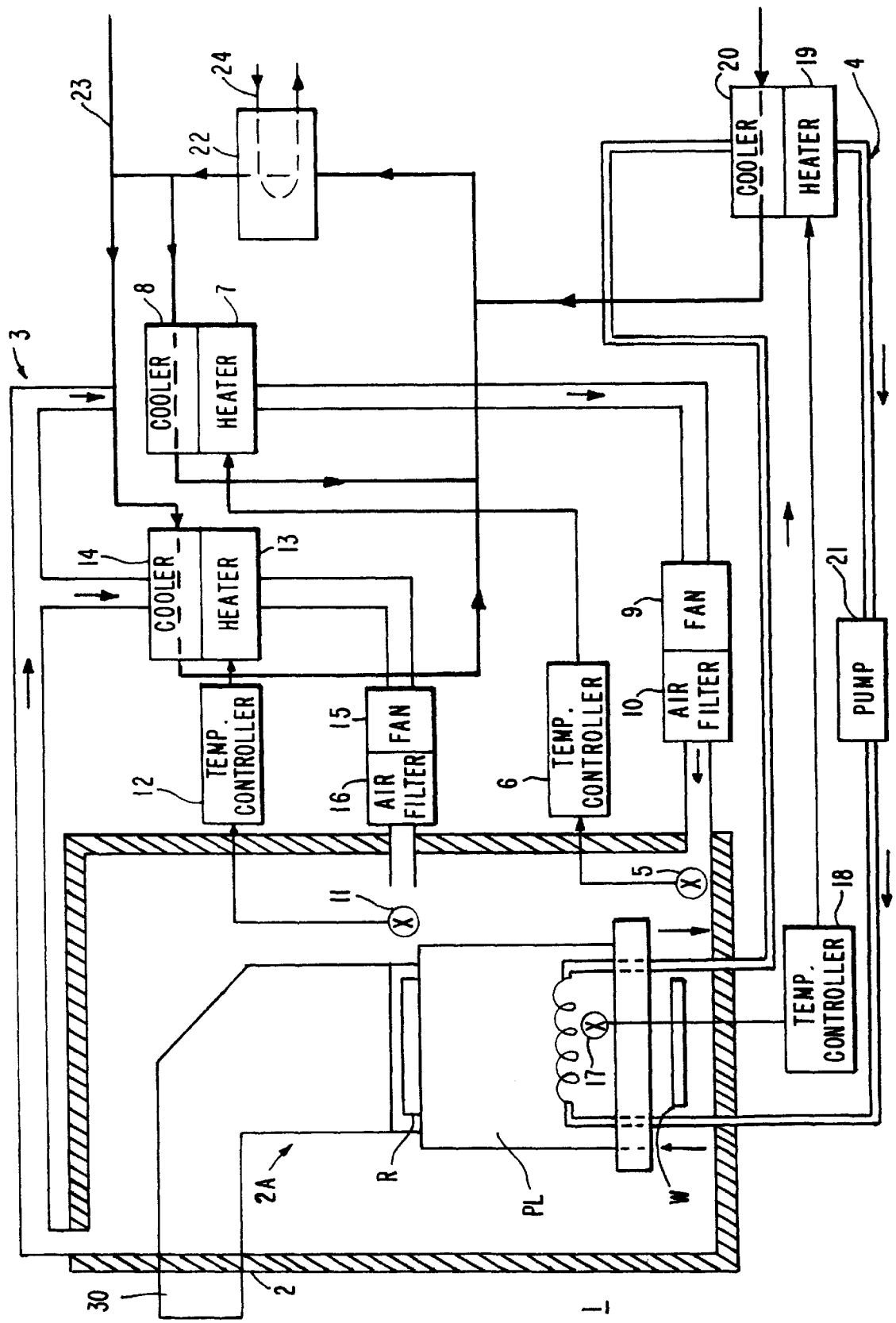

TEMPERATURE-CONTROL METHOD AND APPARATUS

BACKGROUND OF THE INVENTION

The present invention relates to a method and apparatus for temperature control. More particularly, the present invention relates to a method and apparatus for temperature control in an exposure apparatus having a plurality of chambers and utilizing a common refrigerant.

In recent years, the trend toward higher integration of semiconductor integrated circuits has highlighted a projection-exposure apparatus having a high resolution reduction projection lens, wherein a pattern formed on a reticle is projected and transferred onto a wafer. Also, this major trend was enhanced by a stepper which moves a wafer by a step-and-repeat method to project and transfer a pattern onto a plurality of exposed areas on the wafer one after another.

Such a high resolution projection-exposure system, however, generally requires the project lens resolution level of the image alignment precision of one-fifth to one-tenth of the minimum line width of the projection lens. Therefore, a slight temperature change due to changes in exposure conditions can directly deteriorate the alignment precision. For example, a lens which resolves a 0.8 $\mu$m width pattern for manufacturing an ultralarge scale integrated circuit (ULSI) requires an alignment precision of 0.8–0.16 $\mu$m. Therefore, changes in temperatures in air in an optical path of a projected beam can change the refractive index of the projection lens, thereby deteriorating the alignment precision.

For this reason, in a conventional projection-exposure apparatus, a mechanism which controls temperature in each section or enclosure of the apparatus is provided to perform a highly precise alignment. One of the mechanisms uses air as a medium; another mechanism uses liquid as a medium. In a conventional projection-exposure apparatus, the air is used for controlling temperatures in the entire apparatus or in a local section, such as an interferometer. The liquid medium is used for controlling temperature of a projection lens. Note that air as a medium is cooled by a common refrigerant supplied from a freezer. Its temperature is independently controlled by a heater. Also, the temperature of liquid as a medium may be controlled by an electronic cooler.

In the conventional projection-exposure apparatus having such a configuration, a temperature-control system must be constructed for each of the media. This, unavoidably, results in an undesirably large apparatus.

SUMMARY OF THE INVENTION

This invention is devised to solve the above problem and to provide a mechanically simple temperature-control apparatus and method compared to conventional technology.

It is accordingly an object of the present invention to overcome the problems presented by prior art solutions.

In order to solve the above problem, the temperature-control apparatus incorporating the principles of the present invention is arranged to individually cool the different media which separately control temperatures for a plurality of chambers through a common refrigerant.

This configuration eliminates a cooling mechanism using a dedicated refrigerant for each different medium, thus reducing the size of the temperature-control apparatus.

Another object of the present invention is to provide a method of controlling the temperature in a plurality of enclosures. The method includes the steps of controlling the temperature of a first enclosure using a first medium. Also included are the steps of controlling the temperature of a second enclosure using a second medium, different from the first medium, and cooling the first medium and the second medium with a common refrigerant.

A preferred embodiment of the present invention includes apparatus for controlling the temperature in a plurality of enclosures. A first controller is provided for controlling the temperature of a first enclosure using a first medium. A second controller is also included for controlling the temperature of a second enclosure using a second medium, different from the first medium, and a cooling system is utilized for cooling the first and the second mediums with a common refrigerant.

BRIEF DESCRIPTION OF THE DRAWINGS

The above and other objects, features, and advantages of the present invention will become more apparent from the following detailed description taken with respect to the accompanying drawing which is a schematic diagram of a projection-exposure apparatus system in which the apparatus incorporating the principles of the present invention is used.

BRIEF DESCRIPTION OF THE PREFERRED EMBODIMENT

Referring to the drawing, the projection-exposure apparatus system 1 includes a chamber or enclosure 2 for maintaining temperature for the projection-exposure apparatus 2A, and for maintaining its cleanliness constant. The apparatus system 1 also includes temperature-control systems 3 and 4 for controlling the temperature of each of the sections in the projection-exposure apparatus 2A.

A shown in the drawing, the projection-exposure apparatus 2A includes a light source 30 for emitting exposure light, a mask containing a reticle R arranged above the projection-optical system, a projection lens PL which projects an image of the pattern formed on the reticle R onto a photosensitive substrate of a wafer W.

A light source 30 comprises, for example, an ultra high pressure mercury lamp, an excimer laser (KrF, ArF), YAG lasers and the like to emit exposure light to photosensitize the resist as a photosensitizer coated on the wafer W.

Next, a temperature-control system 3 is described.

The temperature-control system 3 in this embodiment uses an air medium, while the temperature-control system 4 uses a liquid medium.

The temperature-control system 3 has two kinds of control systems, one which controls the overall temperature of the entire chamber 2, and the other which controls the local temperatures, such as that of the interferometer in the projection-exposure apparatus 2A.

The control system of the temperature-control system 3, which controls the overall temperature of the entire chamber 2, comprises a temperature sensor 5, a temperature controller 6, a heater 7, a cooler 8, a ventilating fan 9, and an air filter 10. The temperature in the chamber 2 is maintained constant by circulating the air, such that the air taken from the bottom of the chamber 2 via the ventilating fan 9 is discharged from the top of the chamber 2, as indicated by the arrows.

Note that the temperature sensor 5 is provided near an inlet which is arranged at the bottom of the chamber 2 so that the temperature of the air coming into the chamber 2 is accurately sensed.

The temperature controller 6 controls the heater 7, based on the result of the temperature sensor 5, so that the temperature of the uniformly cooled air from the cooler 8 remains constant at a predetermined temperature.

On the other hand, the control system which controls the temperature of a local section in the projection-exposure apparatus 2A comprises a temperature sensor 11, a temperature controller 12, a heater 13, a cooler 14, a ventilation fan 15, and an air filter 16. It is configured to maintain the local temperature constant by circulating the air, such that the air driven into the local section by the fan 15 is discharged from the top of the chamber 2.

This control system is also configured to control the heater 13 based on the reading of the temperature sensor 11, so that the temperature of the uniformly cooled air from the cooler 14 remains constant at a predetermined temperature.

The temperature-control system 4 comprises a temperature sensor 17, a temperature controller 18, a heater 19, a cooler 20, and a pump 21. It is configured to maintain constant the temperature of a projection lens using a liquid medium circulated by the pump 21. Note that this control system is also configured to control the heater 19 based on the reading of the temperature sensor 17, and maintain a constant temperature for the liquid uniformly cooled from the cooler 20.

The configuration of each of the control systems is described above. In the projection-exposure apparatus system 1 of this embodiment, a common refrigerant is supplied to the coolers 8, 14, and 20. In other words, both air and liquid are cooled by a refrigerant, such as an alternate Freon gas 23, which is circulated through a freezer 22. Note that the refrigerant 23 is cooled by cooling water 24.

In this way, a refrigerant system is shared by both the air and liquid media in the projection-exposure system 1. This, unlike a conventional system, eliminates the need for cooling water to be supplied separately to each of the air medium and liquid medium refrigerant systems.

When cooling both the air medium cooling system and the liquid medium cooling system separately, as in the conventional system, the cooling liquid requires an electronic cooling apparatus and a radiator. By configuring the system as in this embodiment, however, such apparatus can be eliminated, thus making the entire system smaller. Since cooling mechanisms of the same configuration can be used for both the air medium cooling system and the liquid medium cooling system, there are components that can be shared, providing advantages for both maintenance and manufacturing cost. This also reduces the number of total components required for maintenance, providing a further advantage in maintenance.

In the above embodiment, a projection-exposure apparatus is described as an example in which a temperature-control apparatus uses different media. However, this invention is not limited to such apparatus only, but can also be applied to other apparatus having a plurality of chambers or enclosures.

Also, the above embodiment has described the projection-exposure apparatus in which the temperature-control system 3, having an air medium, controls the overall temperature for the entire chamber and the local temperature. However, this invention is not limited to this arrangement only, but also is applicable to the case in which the temperature of only one chamber is controlled.

According to the above-mentioned invention, cooling different media that individually control a plurality of chambers through a common refrigerant eliminates the need for a cooling mechanism dedicated to only one medium. Therefore, the temperature-control apparatus can be made much smaller than that of conventional systems.

Various modifications will become possible for those skilled in the art after receiving the teachings of the present disclosure without departing from the scope of the invention.

What is claimed is:

1. An exposure apparatus having a main system for transcribing a pattern formed by a mask onto a plate through a projection lens, said apparatus comprising:

a chamber enclosing said main system;

a first supply system for supplying a first medium within said chamber;

a second supply system for supplying a second medium, different from said first medium, within said chamber;

a cooling system for cooling said first and second media through a common refrigerant and wherein the first supply system supplies said first medium to said projection lens.

2. An exposure apparatus having a main system for transcribing a pattern formed by a mask onto a plate through a projection lens, said apparatus comprising:

a chamber enclosing said main system;

a first supply system for supplying a first medium within said chamber;

a second supply system for supplying a second medium, different from said first medium, within said chamber;

a cooling system for cooling said first and second media through a common refrigerant;

a first detection apparatus for detecting information related to the temperature of said first medium and providing a first output; and a first temperature-control system for controlling the temperature of said first medium based on said output from said first detection apparatus.

3. An exposure apparatus as claimed in claim 2, further comprising:

a second detection apparatus for detecting information related to the temperature of said second medium and providing a second output; and a second temperature-control system for controlling the temperature of said second medium based on said second output from said second detection apparatus.

4. An exposure apparatus for illuminating a mask of a predetermined pattern using an illumination means to project an image of said pattern onto a plate, said apparatus comprising:

a first temperature-control system which controls the temperature in a first chamber in said exposure apparatus using a first medium;

a second temperature-control system which controls the temperature in a second chamber in said exposure apparatus using a second medium, different from said first medium; and a cooling system which cools said first and second media through a common refrigerant.

* * * * *